United States Patent [19]
Geller

[11] 4,255,701
[45] Mar. 10, 1981

[54] VARIABLE PHASE SHIFT APPARATUS

[75] Inventor: William L. Geller, Framingham, Mass.

[73] Assignee: GTE Laboratories Incorporated, Waltham, Mass.

[21] Appl. No.: 103,021

[22] Filed: Dec. 13, 1979

[51] Int. Cl.³ ............................................. H04N 9/12
[52] U.S. Cl. .................................. 323/217; 307/262; 358/28
[58] Field of Search ............... 323/111, 119, 121, 122, 323/128; 358/28; 307/262

[56] References Cited

U.S. PATENT DOCUMENTS

| | | | |
|---|---|---|---|
| 3,637,922 | 1/1972 | Srivastava | 358/28 |
| 3,806,794 | 4/1974 | Vidovic | 323/119 |

FOREIGN PATENT DOCUMENTS

| | | | |
|---|---|---|---|
| 1107814 | 5/1961 | Fed. Rep. of Germany | 323/119 |
| 52-48922 | 4/1977 | Japan | 358/28 |

*Primary Examiner*—William H. Beha, Jr.
*Attorney, Agent, or Firm*—David M. Keay

[57] ABSTRACT

Variable phase shift apparatus employing two transistors having their bases connected together and their collectors connected together. The input terminal is coupled to the emitter of the first transistor. A phase control arrangement of a capacitance and a variable resistance in series is connected between the input terminal and ground. The juncture of the capacitance and the variable resistance is connected to the bases of both transistors. A phase control signal is present at this juncture. The collector current in the first transistor is in phase with the difference between the input signal and the phase control signal. The collector current in the second transistor is 180° out of phase with the phase control signal. The two collector currents are combined by flowing through a common load resistance to produce an output signal which is the resultant of the collector currents in the two transistors. By decreasing the variable resistance the collector current in the first transistor is increased and that in the second transistor decreased. By increasing the variable resistance the collector current in the first transistor is decreased and that in the second transistor increased. Thus by varying the variable resistance the phase of the output signal with respect to the input signal can be varied between 0° and 180°.

8 Claims, 1 Drawing Figure

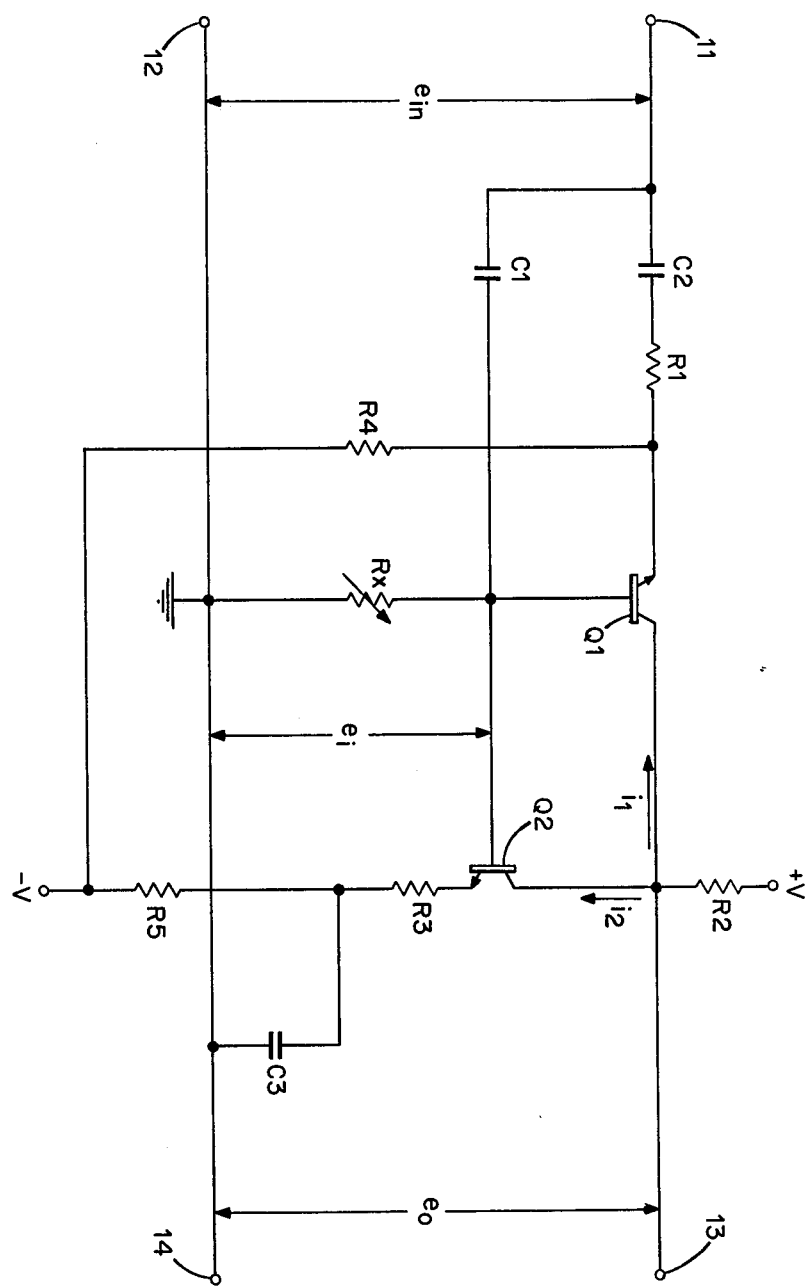

VARIABLE PHASE SHIFT APPARATUS

BACKGROUND OF THE INVENTION

This invention relates to phase shift apparatus. More particularly, it is concerned with phase shift apparatus in which the amount of phase shift can be varied.

Variable phase shift apparatus of different types which are well-known are useful in many applications. One particular application requiring apparatus with variable phase shifting capability is in the display of graphical information on color television sets. In order to provide different colors throughout the display the color subcarrier frequency must be shifted in phase. It is desirable that the phase shift be variable in response to digital signals accompanying the information to be displayed. Although variable phase shift apparatus has been available for use in this particular application, because of the frequency involved (3.58 MHz is the standard color television subcarrier frequency), it has heretofore been necessary to employ high performance, expensive, components.

SUMMARY OF THE INVENTION

Variable phase shift apparatus in accordance with the present invention is relatively simple and inexpensive. The apparatus includes an input terminal for receiving an input signal. The apparatus also includes a first transistor means and a second transistor means. A phase control means is connected to the input terminal and produces a phase control signal of variable magnitude. The first transistor means is connected to the input terminal and to the phase control means and produces a first signal in phase with the difference between the input signal and the phase control signal. The first signal increases in magnitude as the magnitude of the phase control signal decreases, and decreases in magnitude as the magnitude of the phase control signal increases. The second transistor means is connected to the phase control means and produces a second signal at 180° phase shift with respect to the phase control signal. The second signal increases in magnitude as the magnitude of the phase control signal increases, and decreases in magnitude as the magnitude of the phase control signal decreases. An output means is connected to the first and to the second transistor means and combines the first and second signals to produce an output signal which is the resultant of the first and second signals.

BRIEF DESCRIPTION OF THE DRAWING

The single FIGURE of the drawing is a schematic circuit diagram of a variable phase shift apparatus in accordance with the present invention.

For a better understanding of the present invention, together with other and further objects, advantages, and capabilities thereof, reference is made to the following disclosure and appended claims in connection with the above described drawing.

DETAILED DESCRIPTION OF THE INVENTION

A variable phase shift apparatus in accordance with the present invention as illustrated in the single FIGURE of the drawing has input terminals 11 and 12 across which a continuous wave input signal is applied. Input terminal 12 is connected directly to ground. Input terminal 11 is connected through a coupling capacitance C2 and a resistance R1 to the emitter of an NPN bipolar transistor Q1. The collector of transistor Q1 is connected through a load resistance R2 to a positive voltage source +V. The output of the apparatus appears across an output terminal 13 which is connected to the collector of transistor Q1 and an output terminal 14 which is connected to ground.

The input terminal 11 is connected through a series arrangement of a capacitance C1 and a variable resistance Rx to ground. The juncture between the capacitance C1 and resistance Rx is connected directly to the base of transistor Q1. The base of a second NPN bipolar transistor Q2 is also connected directly to the juncture of capacitance C1 and resistance Rx. Its collector is connected directly to the collector of transistor Q1 and to the output terminal 13. The emitter is biased by a connection through two resistances R3 and R5 in series to a negative voltage source −V. The juncture between resistances R3 and R5 is connected to ground through an AC bypass capacitance C3. The emitter of transistor Q1 is connected through a resistance R4 to the negative voltage source −V to provide biasing.

An AC analysis of the apparatus as shown may be expressed by the following equations.

$$e_o = -R(i_1 + i_2) \quad (1)$$
$$e_i = e_{in} \frac{j\omega R_x C}{1 + j\omega R_x C} \quad (2)$$
$$i_1 \cong \frac{e_i - e_{in}}{R} \quad (3)$$
$$i_2 \cong \frac{e_i}{R} \quad (4)$$
$$e_o = e_{in} - 2e_i \quad (5)$$
$$\frac{e_o}{e_{in}} = \frac{1 - j\omega R_x C}{1 + j\omega R_x C} \quad (6)$$
$$\frac{e_o}{e_{in}} = 1 / -2 \tan^{-1} \frac{\omega}{\omega_o}, \text{ where } \omega_o = \frac{1}{R_x C} \quad (7)$$

In the foregoing equations R is the resistance of resistance R2 which in this instance is equal to resistances R1 and R3 in order that the amplitude of the output signal $e_o$ is equal to that of the input signal $e_{in}$. C is the capacitance of capacitance C1, Rx is the resistance of resistance Rx, and ω is the frequency of the input signal.

Capacitance C1 and resistance Rx in series serve as a phase control arrangement. The input signal $e_{in}$ produces a phase control signal $e_i$ across the resistance Rx as shown by equation 2. The magnitude of voltage $e_i$ varies with the resistance of resistance Rx in accordance with equation 2.

Transistor Q1 receives the input signal $e_{in}$ at its emitter and the phase control voltage $e_i$ at its base. The resulting output current $i_1$ as expressed by equation 3 is in phase with its magnitude related to the difference between the phase control voltage $e_i$ and the input voltage $e_{in}$.

The phase control voltage $e_i$ is also applied to the base of transistor Q2. The resulting output current $i_2$ as expressed by equation 4 is of opposite polarity or at 180° phase shift with respect to the phase control voltage $e_i$. Its magnitude is directly related to the phase control voltage $e_i$.

As shown by equation 1 the two collector currents $i_1$ and $i_2$ both of which flow through the load resistance R2 combine to produce a resultant output voltage $e_o$ across the output terminals 13 and 14. With resistances R1, R2, and R3 equal and the amplitude of $e_o$ equal to $e_{in}$ equations 6 and 7 express the relationship of $e_o$ to $e_{in}$. The phase angle between $e_o$ and $e_{in}$ is expressed in equation 7. As shown by equation 7 with a fixed value of capacitance C for capacitance C1, the phase is variable as a function of the variable resistance Rx.

In the circuit as shown and described the phase control arrangement of capacitance C1 and resistance Rx is connected between the input terminal 11 and ground with the resistance connected between the bases of transistors Q1 and Q2 and ground. By virtue of the connection of the resistance Rx to a point of fixed potential, that is ground, the variable resistance Rx may be provided by a set of resistances each in series with a solid state switching element connected in parallel between the bases of transistors Q1 and Q2 and ground. Digital signals appropriately decoded can be applied to the switching elements selectively to close and open individual switching elements, thus varying the value of resistance Rx and consequently the amount of phase shift. Phase shift angles greater than 180° may be obtained by employing phase shifting apparatus as shown together with an inverter to provide an additional 180° phase shift.

In a specific embodiment for providing 0° to 180° phase shift for a continuous wave input signal at the standard color television subcarrier frequency of 3.58 MHz, the following components were employed:

Q1: 2N3904 NPN Transistor
Q2: 2N3904 NPN Transistor
R1: 470Ω
R2: 470Ω
R3: 470Ω
R4: 2.7 kΩ
R5: 2.2 kΩ
C1: 50 pf
C2: 0.01 μf
C3: 0.01 μf
+V: 12 volts
−V: −12 volts The phase angle of the output signal $e_o$ with respect to the input signal $e_{in}$ may be selectively varied from 0° to 180° by changing the value of resistance Rx over a range from 100Ω to 10 kΩ.

While there has been shown and described what is considered to be a preferred embodiment of the present invention, it will be obvious to those skilled in the art that various changes and modifications may be made therein without departing from the invention as defined by the appended claims.

What is claimed is:

1. Variable phase shift apparatus including in combination an input terminal for receiving an input signal;
first transistor means;
second transistor means;
phase control means connected to the input terminal for producing a phase control signal of variable magnitude;
said first transistor means being connected to the input terminal and to the phase control means and being operable to produce a first signal in phase with the difference between the input signal and the phase control signal, said first signal increasing in magnitude as the magnitude of the phase control signal decreases and decreases in magnitude as the magnitude of the phase control signal increases;
said second transistor means being connected to the phase control means and being operable to produce a second signal at 180° phase shift with respect to the phase control signal, said second signal increasing in magnitude as the magnitude of the phase control signal increases and decreasing in magnitude as the magnitude of the phase control signal decreases; and
output means connected to the first and second transistor means for combining the first and second signals to produce an output signal which is the resultant thereof.

2. Variable phase shift apparatus in accordance with claim 1 wherein said phase control means includes a capacitance and a resistance connected in series between the input terminal and a point of reference potential for producing said phase control signal at the juncture of the capacitance and resistance; and
means for varying the value of said resistance whereby the magnitude of the phase control signal is variable.

3. Variable phase shift apparatus in accordance with claim 2 wherein said first transistor means includes a first bipolar transistor;
said second transistor means includes a second bipolar transistor;
the collectors of the first and second transistors are connected together;
the bases of the first and second transistors are connected together and to the juncture of the capacitance and resistance of the phase control means; and
the emitter of the first transistor is coupled to the input terminal.

4. Variable phase shift apparatus including in combination an input terminal for receiving an input signal;
first transistor means;
second transistor means;
phase control means connected to the input terminal for producing a phase control signal of variable magnitude;
said first transistor means being connected to the input terminal and to the phase control means and being operable to produce a first signal in phase with the difference between the input signal and the phase control signal which varies in magnitude with the difference between the magnitude of the phase control signal and the magnitude of the input signal;
said second transistor means being connected to the phase control means and being operable to produce a second signal at 180° phase shift with respect to the phase control signal which varies in magnitude with the magnitude of the phase control signal; and
output means connected to the first and second transistor means for combining the first and second signals to produce an output signal which is the resultant thereof.

5. Variable phase shift apparatus in accordance with claim 4 wherein said phase control means includes a capacitance and a resistance connected in series between the input terminal and a point of reference potential for producing said phase control signal at the juncture of the capacitance and resistance; and
means for varying the value of said resistance whereby the magnitude of the phase control signal is variable.

6. Variable phase shift apparatus in accordance with claim 5 wherein said first transistor means includes a first bipolar transistor;

said second transistor means includes a second bipolar transistor;

the collectors of the first and second transistors are connected together;

the bases of the first and second transistors are connected together and to the juncture of the capacitance and resistance of the phase control means; and the emitter of the first transistor is coupled to the input terminal.

7. Variable phase shift apparatus in accordance with claim 6 including a first source of operating potential;

an output resistance connected between the first source of operating potential and the collectors of the first and second transistors; and an output terminal connected to the juncture of the output resistance and the collectors of the first and second transistors, said output signal being produced at the output terminal.

8. Variable phase shift apparatus in accordance with claim 7 including a second source of operating potential;

first biasing means connected between the second source of operating potential and the emitter of the first transistor; and second biasing means connected between the second source of operating potential and the emitter of the second transistor.

* * * * *